(12) United States Patent
Choi et al.

(10) Patent No.: US 7,956,452 B2
(45) Date of Patent: Jun. 7, 2011

(54) FLIP CHIP PACKAGES

(75) Inventors: Yun-Seok Choi, Hwaseong-si (KR);
Hee-Seok Lee, Yongin-si (KR);
Kyoung-Sei Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/461,639

(22) Filed: Aug. 19, 2009

(65) Prior Publication Data
US 2010/0044851 A1    Feb. 25, 2010

(30) Foreign Application Priority Data
Aug. 21, 2008 (KR) .................. 10-2008-0081637

(51) Int. Cl.
*H01L 23/48* (2006.01)
(52) U.S. Cl. .................. 257/690; 257/E23.012
(58) Field of Classification Search .................. 257/690, 257/782, 693, 734, 737–738, E23.012
See application file for complete search history.

(56) References Cited

U.S. PATENT DOCUMENTS

| | | | |
|---|---|---|---|
| 6,534,422 B1 | 3/2003 | Ichikawa et al. | |
| 6,911,736 B2 | 6/2005 | Nagarajan | |
| 7,324,317 B2 | 1/2008 | Hill et al. | |
| 7,518,230 B2 * | 4/2009 | Miyata et al. | 257/698 |
| 2003/0235019 A1 * | 12/2003 | Ker et al. | 361/56 |
| 2004/0119159 A1 * | 6/2004 | Takahashi | 257/723 |
| 2005/0230746 A1 * | 10/2005 | Eden et al. | 257/330 |
| 2007/0145565 A1 * | 6/2007 | Miyata et al. | 257/690 |
| 2008/0024102 A1 * | 1/2008 | Hebert et al. | 323/282 |
| 2009/0079071 A1 * | 3/2009 | Webb | 257/738 |
| 2009/0096435 A1 * | 4/2009 | Ueunten | 323/282 |
| 2009/0267085 A1 * | 10/2009 | Lee et al. | 257/88 |
| 2009/0278998 A1 * | 11/2009 | El-Ghoroury et al. | 348/744 |
| 2010/0164079 A1 * | 7/2010 | Dekker et al. | 257/676 |

* cited by examiner

*Primary Examiner* — Nathan W Ha
(74) *Attorney, Agent, or Firm* — Harness, Dickey & Pierce, P.L.C.

(57) ABSTRACT

Flip chip packages and methods of manufacturing the same are provided, the flip chip packages may include a package substrate, a semiconductor chip, conductive bumps, a ground pattern and an underfilling layer. The semiconductor chip may be over the package substrate. The conductive bumps may be between the semiconductor chip and the package substrate to electrically connect the semiconductor chip and the package substrate with each other. The ground pattern may ground one of the package substrate and the semiconductor chip. The underfilling layer may be between the package substrate and the semiconductor chip to surround the conductive bumps. The underfilling layer may have a diode selectively located between the ground pattern and the conductive bumps by electrostatic electricity applied to the underfilling layer to protect the semiconductor chip from the electrostatic electricity.

14 Claims, 7 Drawing Sheets

FLIP CHIP PACKAGES

CROSS-RELATED APPLICATIONS

This application claims priority under 35 USC §119 to Korean Patent Application No. 10-2008-0081637, filed on Aug. 21, 2008 in the Korean Intellectual Property Office (KIPO), the contents of which are herein incorporated by reference in their entirety.

BACKGROUND

1. Field

Example embodiments relate to flip chip packages and methods of manufacturing the same. Other example embodiments relate to flip chip packages having a conductive bump and methods of manufacturing the flip chip packages.

2. Description of the Related Art

Generally, various semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

A type of the semiconductor packages may include a flip chip package. The flip chip package may include a semiconductor chip and a package substrate confronting the semiconductor chip. Pads of the semiconductor chip may be electrically connected with circuit patterns of the package substrate via conductive bumps in one-to-one relation.

The conventional flip chip package may have a weak structure with respect to electrostatic electricity. In order to protect the flip chip package from the electrostatic electricity, a blocking member may be provided to the flip chip package. The blocking member may induce the electrostatic electricity to prevent the electrostatic electricity from flowing through the flip chip package. However, the blocking member may not effectively protect the flip chip package from the electrostatic electricity.

SUMMARY

Example embodiments relate to flip chip packages and methods of manufacturing the same. Other example embodiments relate to flip chip packages having a conductive bump and methods of manufacturing the flip chip packages.

Example embodiments provide flip chip packages having a structure that may be more effectively protected from electrostatic electricity. Example embodiments also provide methods of manufacturing the above-mentioned flip chip packages.

According to example embodiments, there is provided a flip chip package. The flip chip package may include a package substrate, a semiconductor chip, conductive bumps, a ground pattern and an underfilling layer. The semiconductor chip may be arranged over the package substrate. The conductive bumps may be interposed between the semiconductor chip and the package substrate to electrically connect the semiconductor chip and the package substrate with each other. The ground pattern may ground the package substrate and the semiconductor chip. The underfilling layer may be interposed between the package substrate and the semiconductor chip to surround the conductive bumps. The underfilling layer may have a diode selectively formed between the ground pattern and the conductive bumps by electrostatic electricity applied to the underfilling layer to protect the semiconductor chip from the electrostatic electricity.

According to example embodiments, the ground pattern may have grounding portions configured to surround the conductive bumps, respectively.

According to example embodiments, the ground pattern may be provided to the semiconductor chip. The ground portion may be provided on a periphery of the semiconductor chip. Alternatively, the ground pattern may be provided to the package substrate. In yet other example embodiments, the ground pattern may be provided to the semiconductor chip and the package substrate.

In example embodiments, the underfilling layer may include a voltage sensitive material that may be converted into the diode by the electrostatic electricity.

According to example embodiments, there is provided a method of manufacturing a flip chip package. In the method of manufacturing the flip chip package, a ground pattern may be formed on a semiconductor chip. Conductive bumps may be formed on the semiconductor chip. The conductive bumps may be mounted on a package substrate. An underfilling layer may be formed between the package substrate and the semiconductor chip to surround the conductive bumps. The underfilling layer may have a diode that may be selectively formed between the ground pattern and the conductive bumps by electrostatic electricity applied to the underfilling layer to protect the semiconductor chip from the electrostatic electricity.

In example embodiments, the method may include forming the ground pattern on an edge portion (or periphery) of the package substrate. In example embodiments, forming the ground pattern may include forming grounding portions configured to surround the conductive bumps, respectively, on the ground pattern.

According to example embodiments, there is provided a method of manufacturing a flip chip package. In the method of manufacturing the flip chip package, conductive bumps may be formed on the semiconductor chip. A ground pattern may be formed on a package substrate. The conductive bumps may be mounted on the package substrate. An underfilling layer may be formed between the package substrate and the semiconductor chip to surround the conductive bumps. The underfilling layer may have a diode selectively formed between the ground pattern and the conductive bumps by electrostatic electricity applied to the underfilling layer to protect the semiconductor chip from the electrostatic electricity.

According to example embodiments, the underfilling layer may have the diode between the ground pattern and the conductive bumps. The electrostatic electricity may flow through the diode, not the semiconductor chip. As such, the flip chip package may be protected from the electrostatic electricity.

BRIEF DESCRIPTION OF THE DRAWINGS

Example embodiments will be more clearly understood from the following detailed description taken in conjunction with the accompanying drawings. FIGS. 1 to 13 represent non-limiting, example embodiments as described herein.

DETAILED DESCRIPTION OF EXAMPLE EMBODIMENTS

Various example embodiments will be described more fully hereinafter with reference to the accompanying drawings, in which some example embodiments are shown. However, specific structural and functional details disclosed herein are merely representative for purposes of describing example embodiments. Thus, the invention may be embodied in many alternate forms and should not be construed as limited to only example embodiments set forth herein.

In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, if an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to flip chip packages and methods of manufacturing the same. Other example embodiments relate to flip chip packages having a conductive bump and methods of manufacturing the flip chip packages.

Hereinafter, example embodiments will be explained in detail with reference to the accompanying drawings.

Figure 1:
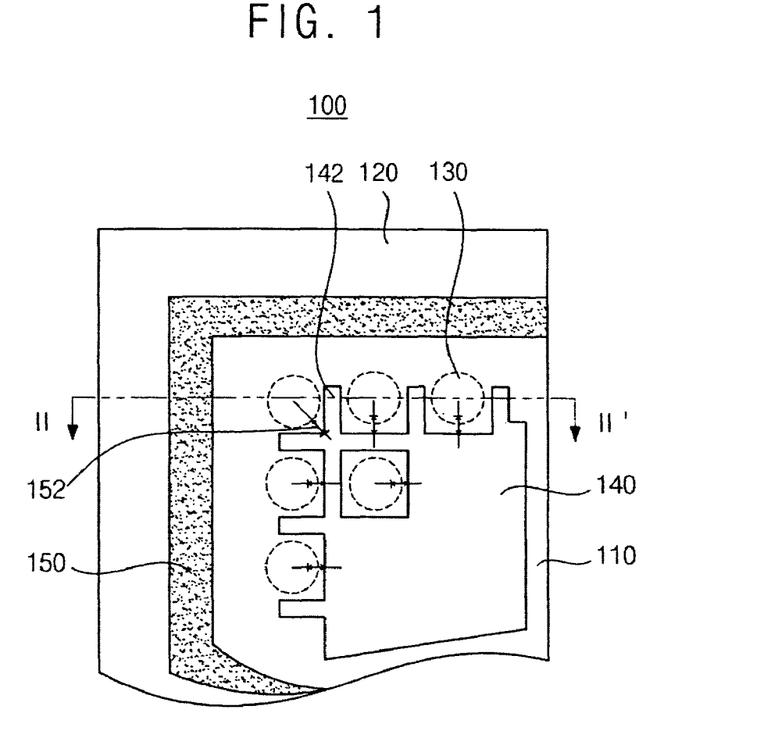
FIG. 1 is a plan view illustrating a flip chip package in accordance with example embodiments.
Figure 2:
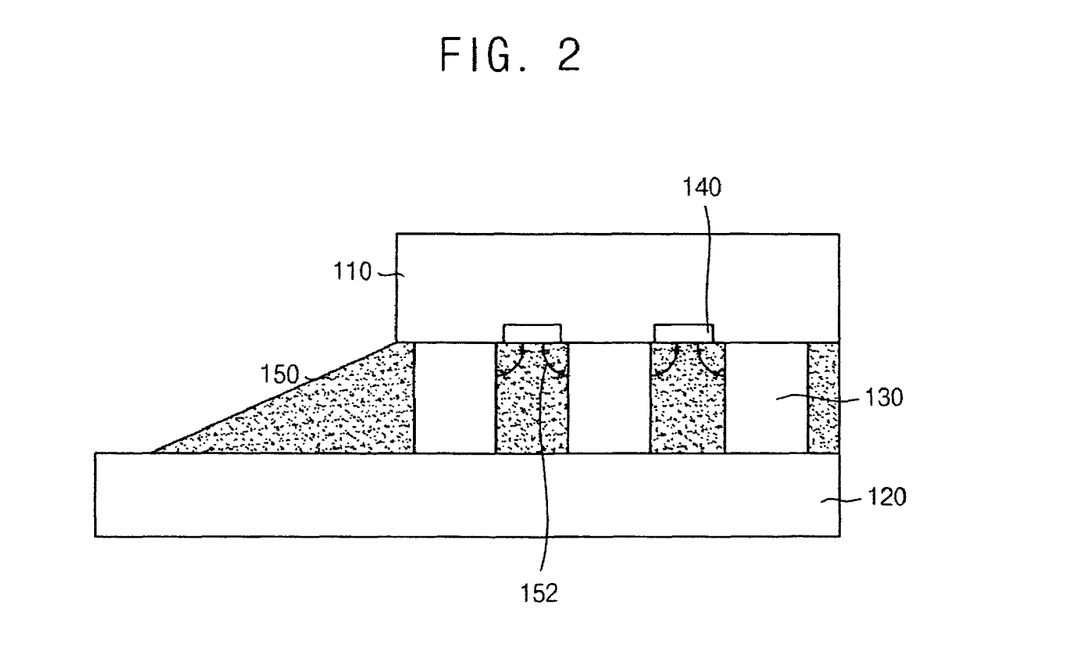
FIG. 2 is a cross-sectional view taken along a line II-II' in FIG. 1.

FIG. 1 is a plan view illustrating a flip chip package in accordance with example embodiments. FIG. 2 is a cross-sectional view taken along a line II-II' in FIG. 1.

Referring to FIGS. 1 and 2, a flip chip package 100 of may include a semiconductor chip 110, a package substrate 120, conductive bumps 130, a ground pattern 140 and an underfilling layer 150.

The semiconductor chip 110 may have a plurality of pads (not shown). The pads may be electrically connected with a plurality of semiconductor structures (not shown) in the semiconductor chip 110. In example embodiments, the pads may be arranged oriented toward a downward direction such that the pads are arranged on a lower surface of the semiconductor chip 110.

The package substrate 120 may be located under the semiconductor chip 110. The package substrate 120 may have a plurality of pads (not shown). In example embodiments, the pads may be arranged toward an upper direction such that the pads may be arranged on an upper surface of the package substrate 120.

The conductive bumps 130 may be interposed between the semiconductor chip 110 and the package substrate 120. The semiconductor chip 110 and the package substrate 120 may be electrically connected with each other via the conductive bumps 130. The conductive bumps 130 may directly contact the pads of the semiconductor chip 110 and the package substrate 120 in order to connect the pads of the semiconductor chip 110 with the pads of the package substrate 120.

The ground pattern 140 may ground the semiconductor chip 110. In example embodiments, the ground pattern 140 may be arranged on the lower surface of the semiconductor chip 110. The ground pattern 140 may have grounding portions 142 configured to extend between the conductive bumps 130 and/or surround the conductive bumps 130. The conductive bumps 130, which may be located away from (or not in direct electrical contact with) the ground pattern 140, may be surrounded with the grounding portions 142 of the ground pattern 140.

The ground pattern 140 may include portions formed on upper edge portions of the package substrate 120. Particularly, because the upper edge portions of the package substrate 120 may be covered with only the underfilling layer 150 (and not the semiconductor chip 110), the ground pattern 140 may also be formed on the uncovered portions of the package substrate 120. For example, the ground pattern 140 may be formed on the upper edge portions of the package substrate 120 that are not covered by the semiconductor chip 110.

The underfilling layer 150 may be interposed between the semiconductor chip 110 and the package substrate 120 to surround the conductive bumps 130. In example embodiments, the underfilling layer 150 may selectively have a diode 152. The diode 152 may be selectively formed between the ground pattern 140 and the conductive bumps 130 to protect the semiconductor chip 110 from electrostatic electricity. The underfilling layer 150 may include a voltage sensitive material. Although the underfilling layer 150 may have an insulating characteristic, the underfilling layer 150 may be converted into a conductive material when the electrostatic electricity is applied to the underfilling layer 150. Thus, the underfilling layer 150 is capable of switching from an insulating material to a conductive material upon application of the electrostatic electricity. When the electrostatic electricity is applied to the underfilling layer 150, the diode 152 may be formed in the underfilling layer 150 to electrically connect the ground pattern 140 and the conductive bumps 130 with each other via the diode 152. Thus, the electrostatic electricity applied to the conductive bumps 130 may not flow through the semiconductor chip 110. Instead, the electrostatic electricity may flow through the ground pattern 140 via the diode 152.

As such, the semiconductor chip 110 may be protected from the electrostatic electricity. Particularly, when the conductive bumps 130 are located away from (or not in direct electrical contact with) the ground pattern 140, the electrostatic electricity may flow through the ground pattern 140 via the diode 152, because the grounding portions 142 may surround the conductive bumps 130. In example embodiments, the underfilling layer 150 having the above-mentioned electrical characteristic may include a metal-containing polymer.

According to example embodiments, the diode 152 in the underfilling layer 150 may connect the ground pattern 140 with the conductive bumps 130. The electrostatic electricity applied to the conductive bumps 130 may flow through the ground pattern 140 and not the semiconductor chip 110. Particularly, when the electrostatic electricity is applied to a region (or end) of the conductive bumps 130 that is away from (or not in direct electrical contact with) the ground pattern 140, the electrostatic electricity may be induced to the ground pattern 140 via the diode 152. As such, the semiconductor chip 110 may be protected from the electrostatic electricity.

Figure 3:
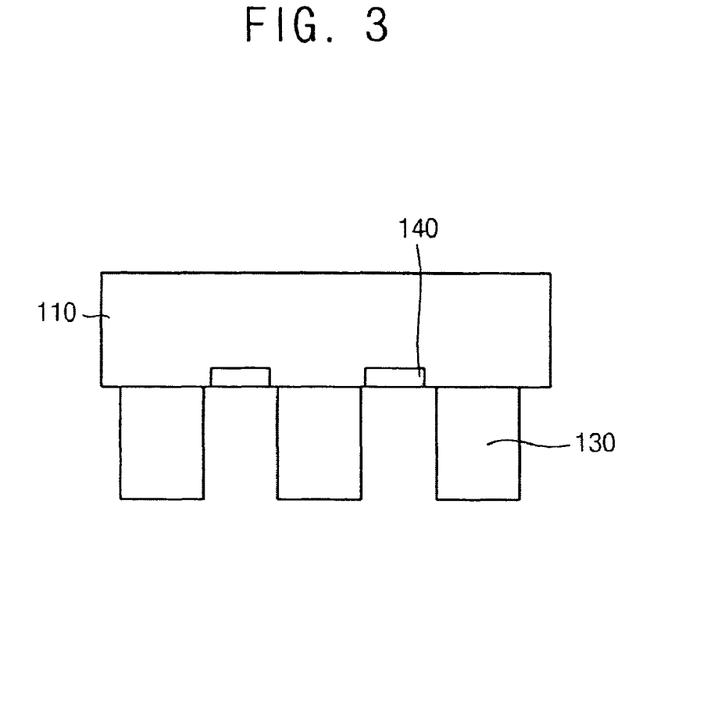
FIGS. 3 to 5 are cross-sectional views illustrating a method of manufacturing the flip chip package in FIG. 1 in accordance with example embodiments.
Figure 4:
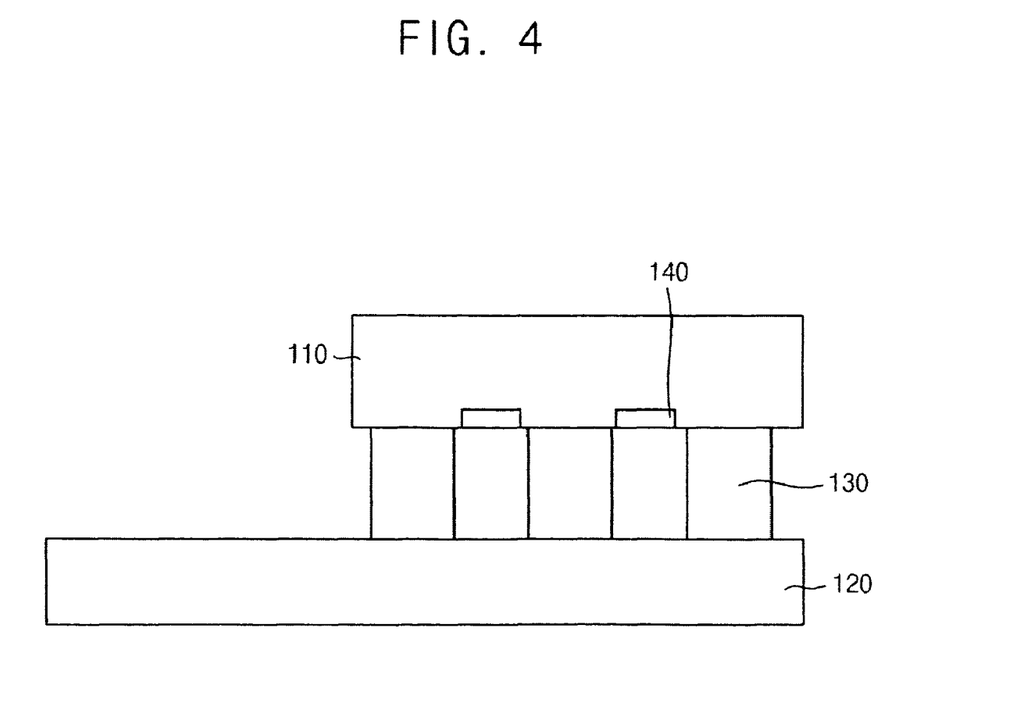
Figure 5:
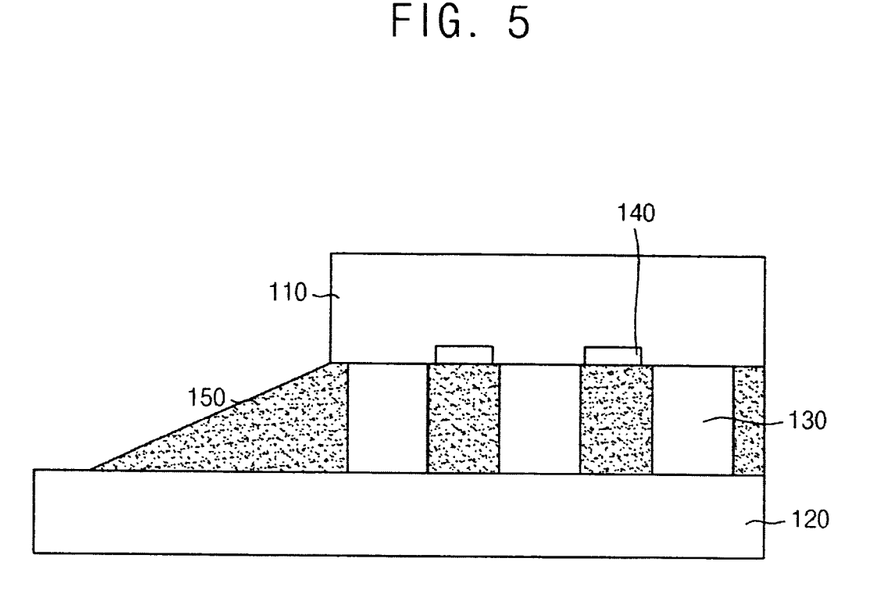

FIGS. 3 to 5 are cross-sectional views illustrating a method of manufacturing the flip chip package in FIG. 1 in accordance with example embodiments.

Referring to FIG. 3, the ground pattern 140 may be formed on the lower surface of the semiconductor chip 110. The ground pattern 140 may have the grounding portions 142 configured to surround regions of the lower surface of the semiconductor chip 110 where the conductive bumps 130 may be formed. In example embodiments, a ground layer (not shown) may be formed on the lower surface of the semiconductor chip 110. The ground layer may be pattern to form the ground pattern 140 having the grounding portions 142. The ground pattern 140 may be exposed through openings of a passivation layer (not shown) formed on the lower surface of the semiconductor chip 110.

The conductive bumps 130 may be formed on the lower surface of the semiconductor chip 110. In example embodiments, the conductive bumps 130 may electrically contact the pads of the semiconductor chip 110. The conductive bumps 130 may be surrounded by the grounding portions 142 of the ground pattern 140.

Referring to FIG. 4, the conductive bumps 130 may be mounted on the package substrate 120. In example embodiments, the conductive bumps 130 may be mounted on the pads of the package substrate 120. The pads of the package substrate 120 may be electrically connected to the pads of the semiconductor chip 110 via the conductive bumps 130.

In example embodiments, the ground pattern 140 may be formed on the upper edge portions (or upper periphery) of the package substrate 120. The ground pattern 140 may be exposed through openings of a passivation layer (not shown) formed on the upper surface of the package substrate 120.

Referring to FIG. 5, the underfilling layer 150 may be formed between the semiconductor chip 110 and the package substrate 120. The underfilling layer 150 may surround the conductive bumps 130 to protect the conductive bumps 130 from external impacts.

As shown in FIG. 2, when an electrostatic electricity higher than a threshold voltage is applied to the underfilling layer 150, the underfilling layer 150 may selectively have the diode 152 between the ground pattern 140 and the conductive bumps 130 to protect the semiconductor chip 110 from the electrostatic electricity. In example embodiments, the underfilling layer 150 may include a voltage sensitive material (e.g., a metal-containing polymer).

Figure 6:
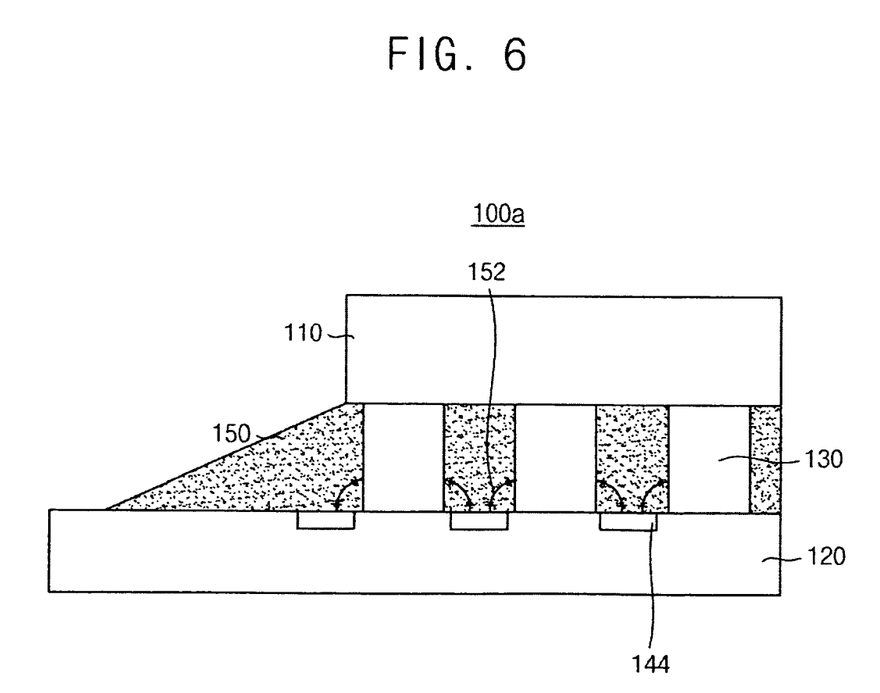
FIG. 6 is a cross-sectional view illustrating a flip chip package in accordance with example embodiments.

FIG. 6 is a cross-sectional view illustrating a flip chip package in accordance with example embodiments.

A flip chip package 100a according to example embodiments may include elements substantially the same as those of the flip chip package 100 shown in FIG. 1 except for a position of the ground pattern. Thus, the same reference numerals refer to the same elements and any further illustrations with respect to the same elements are omitted herein for the sake of brevity.

Referring to FIG. 6, the ground pattern 144 of the flip chip package 100a in accordance with example embodiments may be arranged on the upper surface of the package substrate 120. The electrostatic electricity may flow toward the ground pattern 140 on the package substrate 120 through the diode 152.

Figure 7:
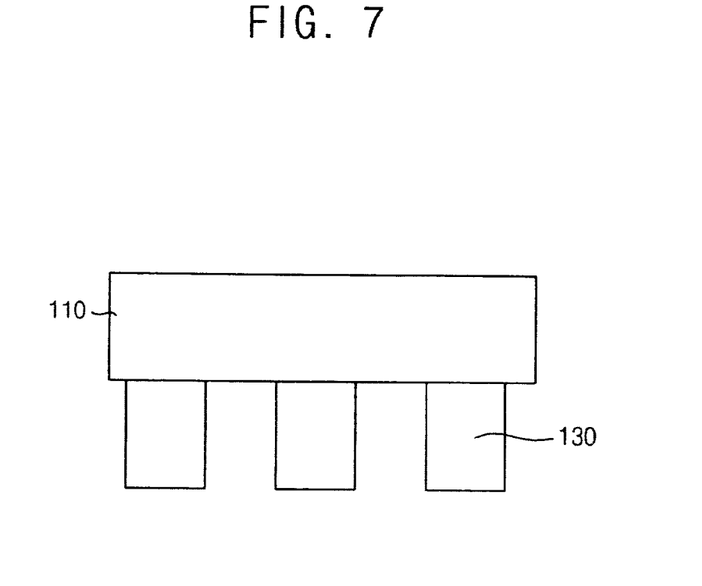
FIGS. 7 to 9 are cross-sectional views illustrating a method of manufacturing the flip chip package in FIG. 6 in accordance with example embodiments.
Figure 8:
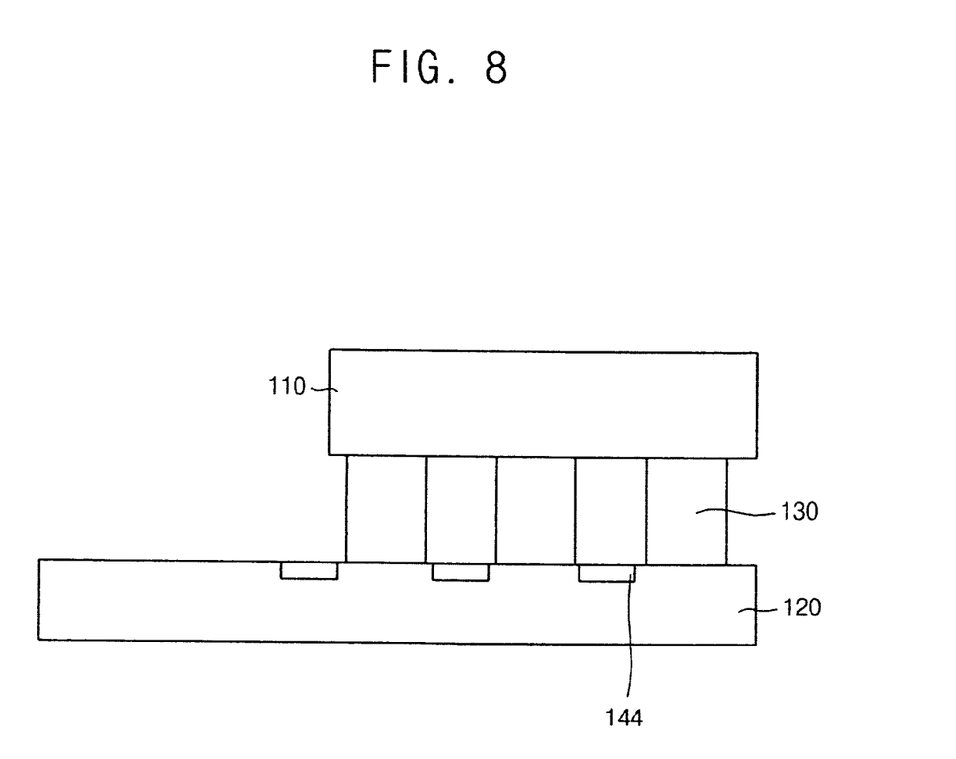
Figure 9:
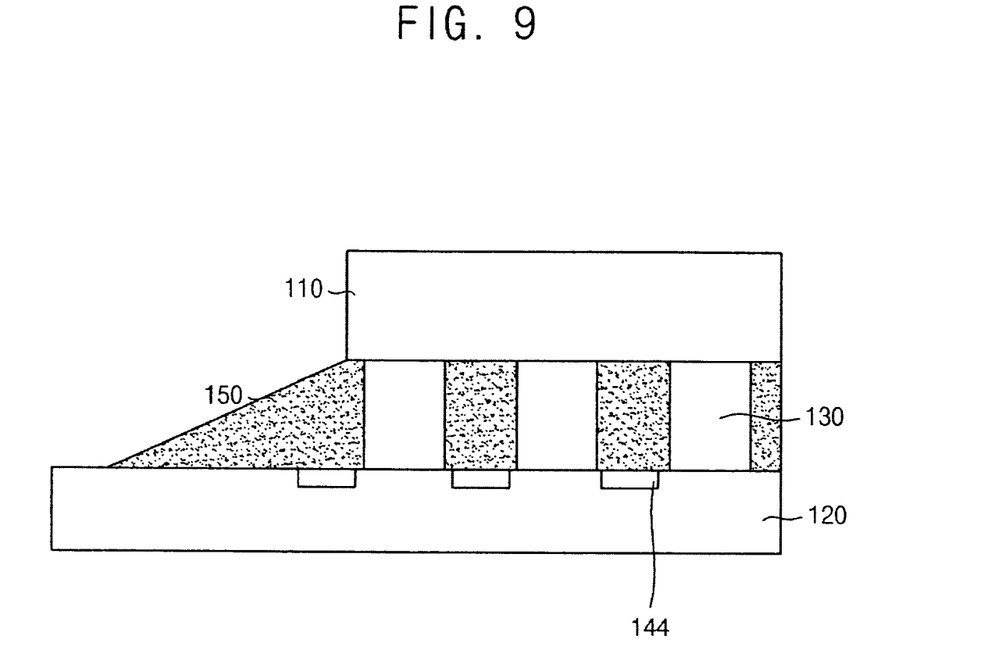

FIGS. 7 to 9 are cross-sectional views illustrating a method of manufacturing the flip chip package in FIG. 6 in accordance with example embodiments.

Referring to FIG. 7, the conductive bumps 130 may be formed on the lower surface of the semiconductor chip 110. In example embodiments, the conductive bumps 130 may electrically contact the pads of the semiconductor chip 110.

Referring to FIG. 8, the ground pattern 144 may be formed on the upper surface of the package substrate 120. The ground pattern 144 may have the grounding portions (not shown) configured to surround regions of the upper surface of the package substrate 120 where the conductive bumps 130 may be mounted. In example embodiments, a ground layer (not shown) may be formed on the upper surface of the package substrate 120. The ground layer may be pattern to form the ground pattern 144 having the grounding portions. The ground pattern 144 may be exposed through openings of a passivation layer (not shown) formed on the upper surface of the package substrate 120.

The conductive bumps 130 may be mounted on the package substrate 120. In example embodiments, the conductive bumps 130 may be mounted on the pads of the package substrate 120. The pads of the package substrate 120 may be electrically connected to the pads of the semiconductor chip 110 via the conductive bumps 130.

Referring to FIG. 9, the underfilling layer 150 may be formed between the semiconductor chip 110 and the package substrate 120. The underfilling layer 150 may surround the conductive bumps 130 to protect the conductive bumps 130 from external impacts.

As shown in FIG. 6, when an electrostatic electricity higher than a threshold voltage is applied to the underfilling layer 150, the underfilling layer 150 may selectively have the diode 152 between the ground pattern 144 and the conductive bumps 130 to protect the semiconductor chip 110 from the electrostatic electricity. In example embodiments, the underfilling layer 150 may include a voltage sensitive material (e.g., a metal-containing polymer).

Figure 10:
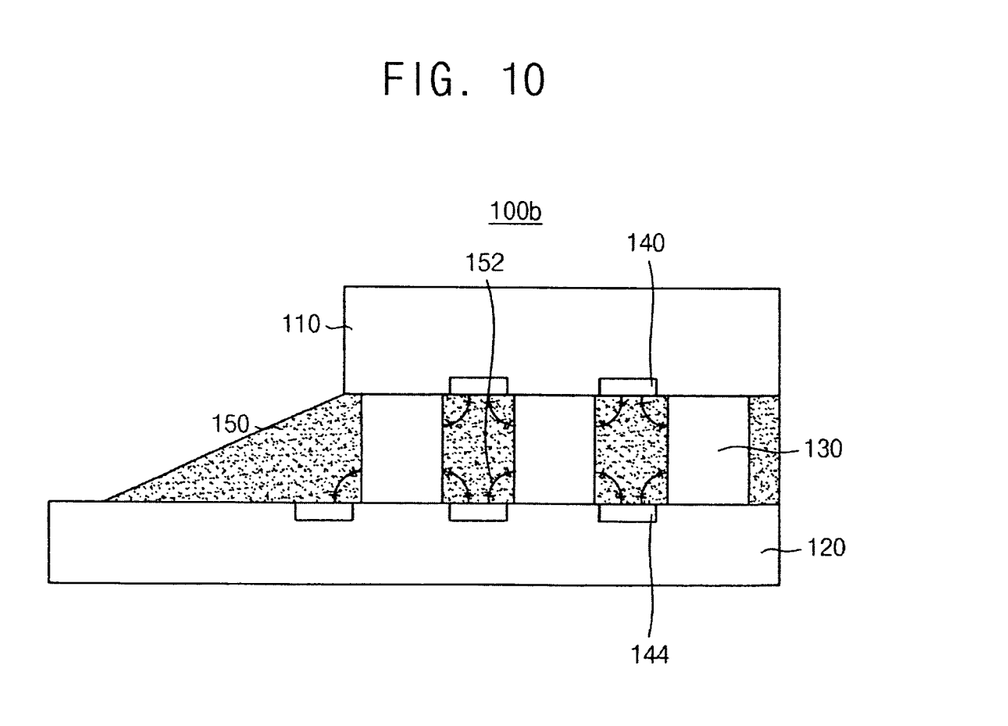
FIG. 10 is a cross-sectional view illustrating a flip chip package in accordance with example embodiments.

FIG. 10 is a cross-sectional view illustrating a flip chip package in accordance with example embodiments.

A flip chip package 100b in accordance with example embodiments may include elements substantially the same as those of the flip chip package 100 shown in FIG. 1 except for positions of the ground patterns. Thus, the same reference numerals refer to the same elements and any further illustrations with respect to the same elements are omitted herein for the sake of brevity.

Referring to FIG. 10, the ground patterns 140 and 144 of the flip chip package 100b in accordance with example embodiments may be arranged on the lower surface of the semiconductor chip 110 and the upper surface of the package substrate 120. The electrostatic electricity may flow toward the ground patterns 140 and 144 on the semiconductor substrate 110 and the package substrate 120 through the diodes 152.

Figure 11:
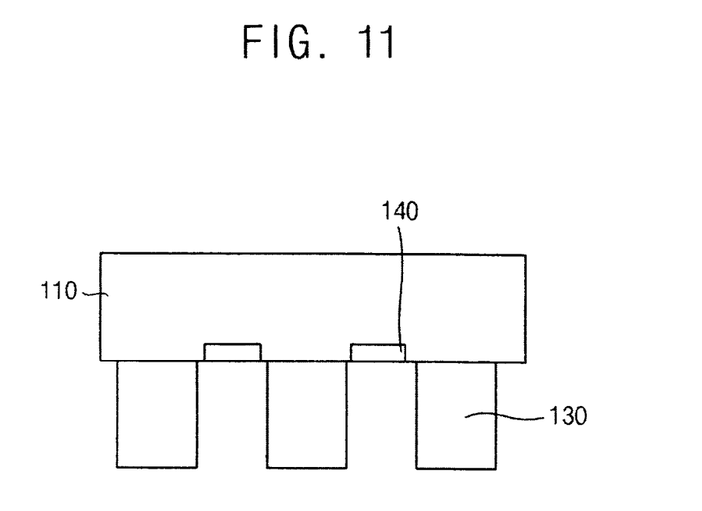
FIGS. 11 to 13 are cross-sectional views illustrating a method of manufacturing the flip chip package in FIG. 10 in accordance with example embodiments.
Figure 12:
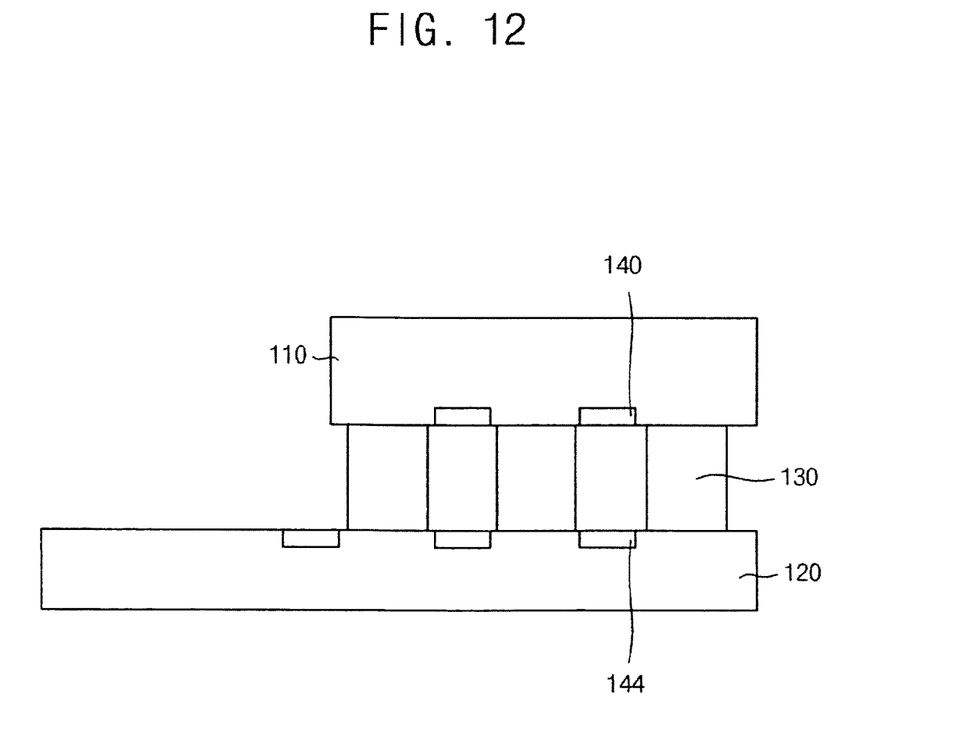
Figure 13:
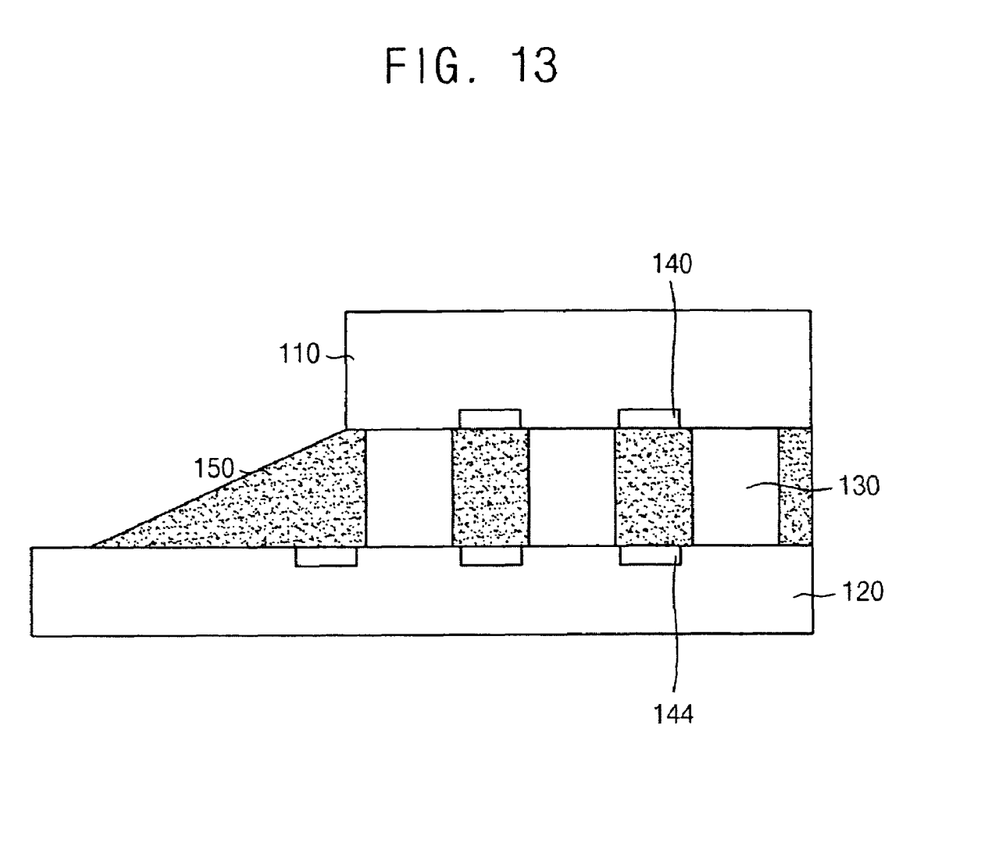

FIGS. 11 to 13 are cross-sectional views illustrating a method of manufacturing the flip chip package in FIG. 10 in accordance with example embodiments.

Referring to FIG. 11, the ground pattern 140 may be formed on the lower surface of the semiconductor chip 110. The ground pattern 140 may have the grounding portions (not shown) configured to surround regions of the lower surface of the semiconductor chip 110 where the conductive bumps 130 may be formed. The conductive bumps 130 may be formed on the lower surface of the semiconductor chip 110.

Referring to FIG. 12, the ground pattern 144 may be formed on the upper surface of the package substrate 120. The ground pattern 144 may have the grounding portions (not shown) configured to surround regions of the upper surface of the package substrate 120 where the conductive bumps 130 may be mounted.

The conductive bumps 130 may be mounted on the package substrate 120. In example embodiments, the conductive bumps 130 may be mounted on the pads of the package substrate 120. The pads of the package substrate 120 may be electrically connected to the pads of the semiconductor chip 110 via the conductive bumps 130.

Referring to FIG. 13, the underfilling layer 150 may be formed between the semiconductor chip 110 and the package substrate 120. The underfilling layer 150 may surround the conductive bumps 130 to protect the conductive bumps 130 from external impacts.

As shown in FIG. 10, when an electrostatic electricity higher than a threshold voltage is applied to the underfilling layer 150, the underfilling layer 150 may selectively have the diode 152 between the ground patterns 140 and 144 and the conductive bumps 130 to protect the semiconductor chip 110 from the electrostatic electricity. In example embodiments, the underfilling layer 150 may include a voltage sensitive material (e.g., a metal-containing polymer).

The above-mentioned example embodiments may be applied to the flip chip package. Alternatively, the example embodiments may also be applied to other semiconductor packages that may have the underfilling layer including the voltage sensitive material.

According to example embodiments, the diode in the underfilling layer may connect the ground pattern with the conductive bumps. The electrostatic electricity applied to the conductive bumps may flow through the ground pattern, not the semiconductor chip. Particularly, when electrostatic electricity is applied to the conductive bumps that are away from (or not in direct electrical contact with) the ground pattern, the electrostatic electricity may be induced to the ground pattern via the diode. As such, the semiconductor chip may be protected from the electrostatic electricity.

A semiconductor package, for example on a printed circuit board (PCB), may include the flip chip packages described above with reference to FIGS. 1, 6 and 10.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flip chip package, comprising:
    a package substrate;
    a semiconductor chip over the package substrate;
    a plurality of conductive bumps between the semiconductor chip and the package substrate, wherein the conductive bumps electrically connect the semiconductor chip and the package substrate with each other;
    a first ground pattern that grounds at least one of the package substrate and the semiconductor chip; and
    an underlining layer between the package substrate and the semiconductor chip, wherein the underfilling layer surrounds the plurality of conductive bumps, and the underfilling layer has a first diode selectively located between the first ground pattern and the plurality of conductive bumps by an electrostatic electricity applied to the underfilling layer to protect the semiconductor chip from the electrostatic electricity.

2. The flip chip package of claim 1, wherein the first ground pattern has a plurality of grounding portions that surround each of the plurality of conductive bumps.

3. The flip chip package of claim 2, wherein the plurality of conductive bumps are not in direct electrical contact with the first ground pattern.

4. The flip chip package of claim 1, wherein the first ground pattern is provided to the semiconductor chip.

5. The flip chip package of claim 1, wherein the first ground pattern is provided to the package substrate.

6. The flip chip package of claim 5, wherein the first ground pattern is on a periphery of the package substrate.

7. The flip chip package of claim 5, further a second ground pattern provided to the semiconductor chip.

8. The flip chip package of claim 7, wherein the second ground pattern is on a periphery of the semiconductor chip.

9. The flip chip package of claim 7, wherein each of the first and second ground patterns has a plurality of grounding portions that surround each of the plurality of conductive bumps.

10. The flip chip package of claim 7, further comprising a second diode selectively located between the second ground pattern and the plurality of conductive bumps.

11. The flip chip package of claim 1, wherein the underfilling layer includes a voltage sensitive material capable of being converted into the first diode by the electrostatic electricity.

12. The flip chip package of claim 10, wherein the voltage sensitive material includes a metal-containing polymer.

13. The flip chip package of claim 1, wherein the underfilling layer is capable of switching from an insulating material to a conductive material upon application of the electrostatic electricity.

14. The flip chip package of claim 1, where the first diode is a conductive material.

* * * * *